United States Patent
Kelly et al.

(10) Patent No.: US 8,181,149 B1
(45) Date of Patent: May 15, 2012

(54) INTERFACE FOR MANAGING MULTIPLE IMPLEMENTATIONS OF A FUNCTIONAL BLOCK OF A CIRCUIT DESIGN

(75) Inventors: Sean A. Kelly, Boulder, CO (US); Gabor Szedo, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 351 days.

(21) Appl. No.: 12/553,726

(22) Filed: Sep. 3, 2009

(51) Int. Cl.
*G06F 17/50* (2006.01)
(52) U.S. Cl. ........................ 716/139; 716/119
(58) Field of Classification Search .................. 716/118, 716/119, 126, 139, 102, 104
See application file for complete search history.

(56) References Cited

U.S. PATENT DOCUMENTS 7,086,014 B1 * 8/2006 Bartz et al. ..................... 716/102
7,756,686 B2 * 7/2010 Kiffmeier et al. ................. 703/2

OTHER PUBLICATIONS

Math Works, Inc., The, "Simulink®, About Conditional Subsystems," *About Conditional Subsystems :: Creating Conditional Subsystems (Simulink®)*, 1986. May 19, 2009. pp. 1-34, <http://www.mathworks.com/access/helpdesk/help/toolbox/simulink/ug/bra7wiw.html>.

* cited by examiner

*Primary Examiner* — Vuthe Siek
(74) *Attorney, Agent, or Firm* — LeRoy D. Maunu

(57) ABSTRACT

Approaches for assembling an electronic circuit design. A processor performs operations including instantiating and coupling a plurality of instances of functional blocks in the design, including at least one meta block instance. The plurality of instances of functional blocks are displayed as respective graphical objects and identifiers of two or more implementations for the meta block instance from a meta block library are displayed. In response to designer selection of one implementation from the meta block library, a specification of the selected one implementation for the meta block instance is stored in association with the design. In response to designer selection of a graphical object corresponding to the at least one meta block instance, a designer-editable version of the one implementation is displayed. An updated specification of the one implementation associated with design is stored in response to designer modification of the designer-editable version of the one implementation.

17 Claims, 6 Drawing Sheets

INTERFACE FOR MANAGING MULTIPLE IMPLEMENTATIONS OF A FUNCTIONAL BLOCK OF A CIRCUIT DESIGN

FIELD OF THE INVENTION

The present invention generally relates to an interface for managing multiple implementations that are available for a functional block of a circuit design.

BACKGROUND

The System Generator high-level modeling system (HLMS) from XILINX, Inc., provides a suite of tools for creating and simulating an electronic circuit design. The System Generator HLMS provides a graphical user interface (GUI) through which a designer assembles a design from a library of functional blocks. The functional blocks are represented to the designer as graphical objects having various shapes and attributes. A design is assembled by dragging and dropping the blocks into a design area and making the required connections.

Each of the functional blocks specifies a particular function on a set of inputs, and specifies the production of one or more output signals from the application of that function. The library may have different versions of a particular functional block for achieving the same function, but emphasizing different design objectives. For example, there may be different versions of a functional block, all performing the same function, but each placing different levels of emphasis on one or more design objectives such as area, power, or timing.

In some situations, a designer may create multiple versions of the same design. As with individual functional blocks having different versions, each version of the design may be tailored for certain design objectives. The different versions may be a result of each of the design versions having different versions of one or more functional blocks.

Preparing or maintaining multiple versions of a design may be problematic. In order to prepare a different version of the design, the different versions of selected functional blocks must be manually deleted from and inserted in each version of the design. Also, changes made to one version of a functional block in one of the versions of the design may need to be reflected in all instances of the functional block across all versions of the design. The manual updating of different versions of a design may increase the likelihood of introducing an error in the design.

The present invention may address one or more of the above issues.

SUMMARY

The various embodiments of the invention provide approaches for assembling an electronic circuit design. In one embodiment, a method includes performing operations by one or more processors in a computing arrangement. The operations include instantiating and coupling a plurality of instances of functional blocks in the design in response to designer input. The plurality of instances of functional blocks includes at least one meta block instance. The plurality of instances of functional blocks is displayed as respective graphical objects, and identifiers of two or more implementations for the meta block instance from a meta block library are displayed for designer selection. In response to designer selection of one implementation from the meta block library, a specification of the selected one implementation for the meta block instance is stored in association with the design. In response to designer selection of a graphical object corresponding to the at least one meta block instance, a designer-editable version of the one implementation is displayed. An updated specification of the one implementation associated with the design is stored in response to designer modification of the designer-editable version of the one implementation.

In another embodiment, an article of manufacture is provided. The article of manufacture includes a processor-readable storage device configured with instructions for assembling an electronic circuit design when executed by one or more processors. The operations performed by the processor include instantiating and coupling a plurality of instances of functional blocks in the design in response to designer input. The plurality of instances of functional blocks includes at least one meta block instance. The plurality of instances of functional blocks is displayed as respective graphical objects, and identifiers of two or more implementations for the meta block instance from a meta block library are displayed for designer selection. In response to designer selection of one implementation from the meta block library, a specification of the selected one implementation for the meta block instance is stored in association with the design. In response to designer selection of a graphical object corresponding to the at least one meta block instance, a designer-editable version of the one implementation is displayed. An updated specification of the one implementation associated with design is stored in response to designer modification of the designer-editable version of the one implementation.

A computing arrangement is provided in another embodiment. The computing arrangement includes at least one processor, a memory arrangement, and a display device. The memory is configured with instructions for assembling an electronic circuit design when executed by the at least one processor. The operations performed by the processor include instantiating and coupling a plurality of instances of functional blocks in the design in response to designer input. The plurality of instances of functional blocks includes at least one meta block instance. The plurality of instances of functional blocks is displayed as respective graphical objects, and identifiers of two or more implementations for the meta block instance from a meta block library are displayed for designer selection. In response to designer selection of one implementation from the meta block library, a specification of the selected one implementation for the meta block instance is stored in association with the design. In response to designer selection of a graphical object corresponding to the at least one meta block instance, a designer-editable version of the one implementation is displayed. An updated specification of the one implementation associated with design is stored in response to designer modification of the designer-editable version of the one implementation.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

The various embodiments of the invention provide a meta block for use in preparing electronic circuit designs. A meta block provides a designer with the ability to select from multiple alternative implementations for a functional block. Each of the alternative implementations performs an equivalent function. However, the manner in which that function is accomplished is different between the implementations. For example, one implementation may be structured to minimize the area that would be occupied by the resulting circuit, and another implementation may be structured to minimize power consumption.

If the designer wants to change some attribute of the selected implementation for a meta block in a design, the designer may select that meta block for editing through a graphical user interface (GUI) in which the meta block is shown as connected to one or more functional blocks of the design. Thus, a designer can navigate to and edit an implementation of a meta block just as the designer navigates to and edits other functional blocks of the design.

In addition to being editable, the alternative implementations are synthesizable into gate-level logic. Thus, when the designer is satisfied with the functional behavior of the design, the chosen implementations of the meta blocks along with the functional blocks can be synthesized. Thus, the designer need not separately maintain both a block-diagrammatic version of the design and also a synthesizable version of the design which includes the selected different implementations of meta blocks.

Figure 1:
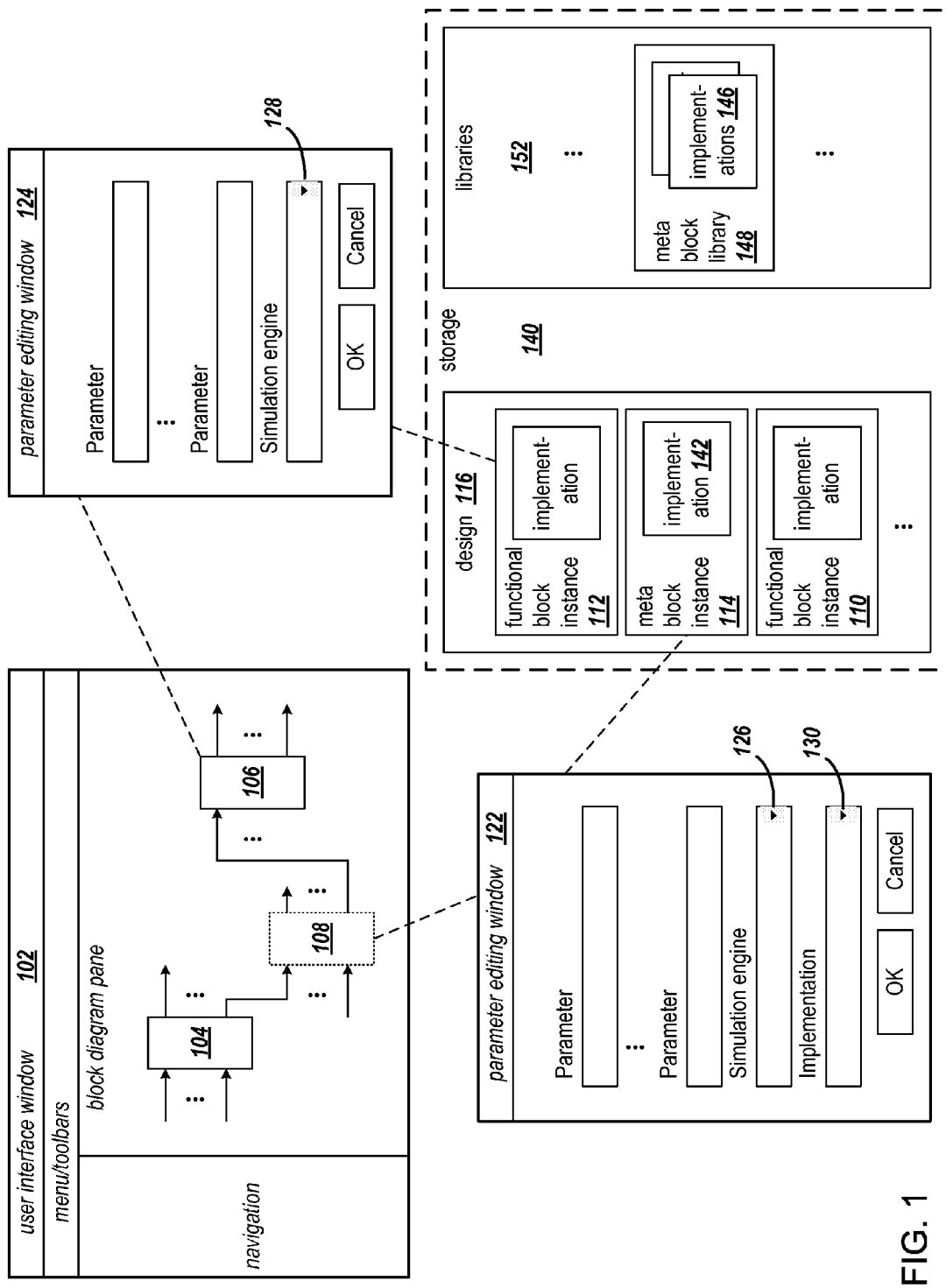
FIG. 1 shows a GUI window and an example of a partial design that includes a meta block instance.

FIG. 1 shows a GUI window 102 and an example of a partial design that includes a meta block instance. The user interface window 102 provides the top-level interface for assembling and editing a design. While not shown, it will be appreciated that a design may be assembled by dragging and dropping blocks from a library into a design pane and connecting those blocks according to the desired overall function. A block diagram representation of a portion of the design is shown in the block diagram pane.

The illustrated portion of the design includes graphical objects 104, 106, and 108, which represent block instances 110, 112, and 114, respectively of the design 116, as instantiated by a designer. Blocks 104 and 106 depict functional block instances with only one available implementation, and block 108 depicts a meta block instance that has multiple implementations available for selection by the designer. For ease of reference, a graphical object and the corresponding block instance may both be referred to as a "block."

Parameter editing window 122 provides an interface for editing the parameters of the meta block instance 114, and parameter editing window 124 provides an interface for editing the parameters of the functional block instance 112. The two parameter editing windows show the difference between a functional block having only one available implementation and a meta block instance having multiple possible implementations.

The parameter editing windows 122 and 124 are displayed to a designer in response to selection of the blocks 108 and 106, respectively, and selection of a parameter editing function (e.g., right clicking on a block and selecting an option from a menu). The parameter editing windows for functional block instances and meta block instances both provide interfaces for editing the one or more parameter values for the associated blocks. Examples of general parameters include constants used by the block in performing the designated function, or port widths.

The parameter editing windows further provide an interface for selecting a target simulation engine for a block. The blocks of a design may be simulated with different simulation engines. That is, some blocks of the design are modeled and simulated using the block-based simulation engine provided as part of the design tool through which the design is assembled, such as the SIMULINK simulation engine, for example, and others of the blocks are compiled into software that executes and interfaces with the block-based simulation engine provided by the design tool. Using the executable software version of a block in the simulation instead of simulating with a model of that same block permits the simulation to run faster since the simulation engine does not have to individually model and simulate each block that is nested in the block that was compiled in to software.

In another embodiment, the available simulation engines include a hardware-based engine. With a hardware-based engine, the selected blocks of the design are implemented as circuits on hardware such as a programmable logic device (PLD). Thus, simulation of the design can be configured to simulate some of the blocks as software and others of the blocks as circuits on a PLD.

In one embodiment, the block is not compiled into a software or hardware simulation model until it is needed for simulation.

The parameter editing window 122 for meta block 108 and the parameter editing window 124 for block 106 each include an interface (e.g., a pull-down list) for the designer to select a simulation engine. Window 122 is shown with pull-down list 126 and window 124 is shown with pull-down list 128 for selecting the simulation engines for blocks 108 and 106, respectively.

Window 122 includes an interface for selecting one of multiple alternative implementations for block 108, whereas window 124 does not have an interface for selecting an implementation since block 106 has only one implementation according to the example. The implementation of a block describes a design for achieving the function required of that block. A block may include nested blocks which are suitably connected for performing the block's function, along with data for rendering a graphical depiction of the implementation in block diagram form. In one embodiment, an implementation further includes a specification that can be synthesized into gate-level logic. For example, the implementation may be specified in a hardware description language (HDL) such as Verilog or VHDL. The example interface for selecting an implementation for block 108 is pull-down list 130.

Data that describe the design 116 are stored in storage arrangement 140. The data include descriptions of each of the blocks that comprise the design and descriptions of how those blocks are connected. In the example partial design, data are shown for functional block instances 110 and 112 and meta block instance 114. The designer has no option to select one of multiple alternative implementations for functional block instances 110 and 112. However, there are multiple implementations from which to choose for meta block instance 114. Meta block instance 114 is shown with implementation 142, which is one of implementations 146 in meta block library 148.

Libraries 152 include definitions of various blocks (not shown) and meta blocks from which the designer may choose in creating design 116. Each meta block in the libraries 152 is defined in terms of a meta block library, and the meta block library includes multiple alternative implementations for a meta block. For example, the meta block library 148 includes implementations 146. Implementation 142, which is shown as defining meta block instance 114 in the design 116, is one of the implementations 146 as selected by a designer.

Figure 2:
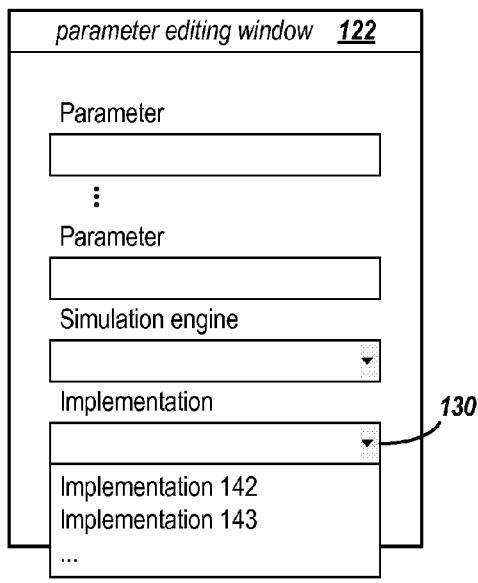
FIG. 2 shows an example parameter editing window for selecting one of multiple implementations for a meta block instance.

FIG. 2 shows the example parameter editing window 122 of FIG. 1 for selecting one of multiple implementations for the meta block instance 114 of FIG. 1. The pull-down list 130 lists example implementations 142 and 143 for selection by the designer.

Figure 3:
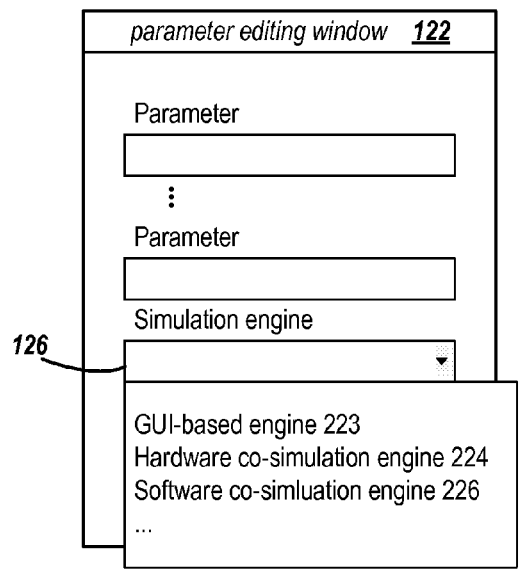
FIG. 3 shows an example parameter editing window for selecting one of multiple simulation engines for a block.

FIG. 3 shows the example parameter editing window 122 of FIG. 1 for selecting one of multiple simulation engines for a block of FIG. 1. The pull-down list 126 lists the alternative simulations engines, GUI-based, hardware co-simulation, or software co-simulation. When the GUI-based engine is selected, the block is modeled and will be simulated by the built-in simulation engine of the tool used to create the design. When the hardware co-simulation engine is selected, the block will be simulated with a circuit implemented on a PLD while other blocks of the design are simulated on the GUI-based engine. When the software co-simulation engine is selected, the block will be compiled into software that executes during simulation and interfaces with the GUI-based engine that is simulating other blocks of the design.

Figure 4:
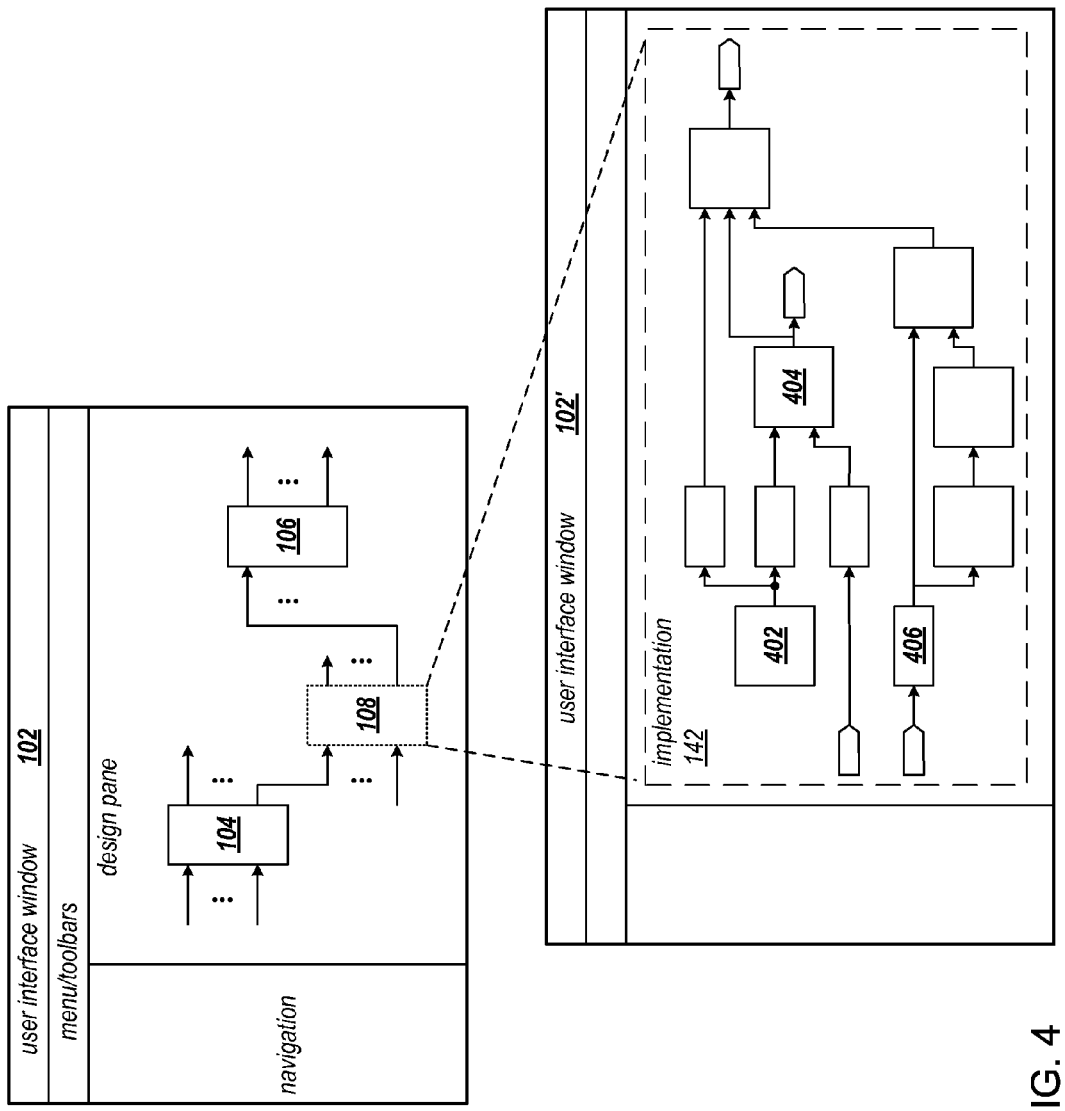
FIG. 4 shows a GUI window and the example partial design from FIG. 1 in which the selected implementation of the meta block has been selected for editing.

FIG. 4 shows GUI window 102 and the example partial design from FIG. 1 in which the selected implementation 142 of the meta block 108 has been selected for editing. In response to user selection of block 108, user interface window 102' displays implementation 142 for editing.

The example implementation 142 of block 108 includes multiple nested blocks, for example labeled blocks 402, 404, and 406 (as well as those that are not labeled). The nested blocks in implementation 142 of meta block 108 can be edited in the same manner that any nested blocks in a non-meta block (e.g., block 106) can be edited. The parameters of each nested block within implementation 142 can be edited, and new nested blocks may be added and others deleted according to design objectives.

Changes to the implementation 142 by a designer are stored back to the design 116 (FIG. 1). In accordance with further embodiments of the invention, the designer is provided with different controls over whether or not changes made to an implementation in a meta block instance are stored back to the meta block library and whether or not a change to the implementation in a meta block library is automatically reflected in the implementation in the meta block instance. In one embodiment, the different controls provided to the designer are referred to as copyback, link, and unlink.

Figure 5A:
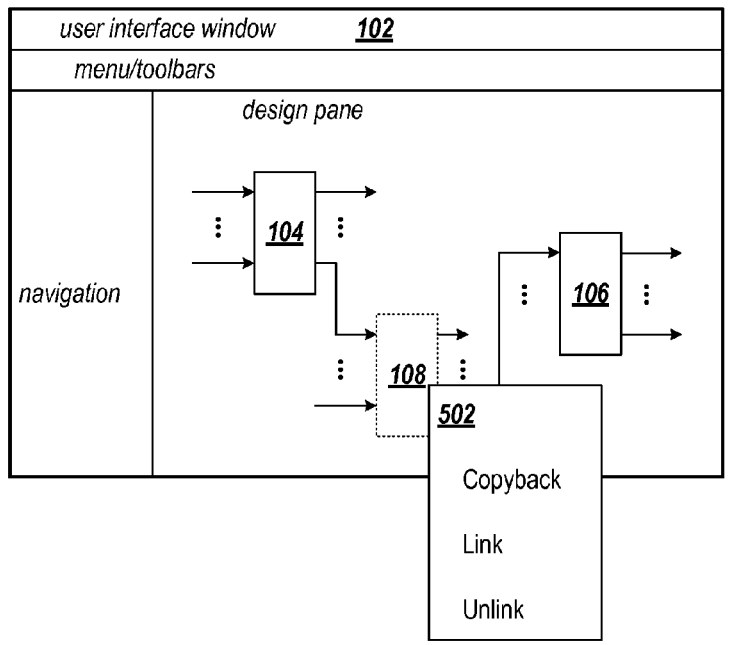
FIG. 5A illustrates a user interface for relating updates made to an implementation between a meta block instance and the corresponding implementation in a meta block library.
Figure 5B:
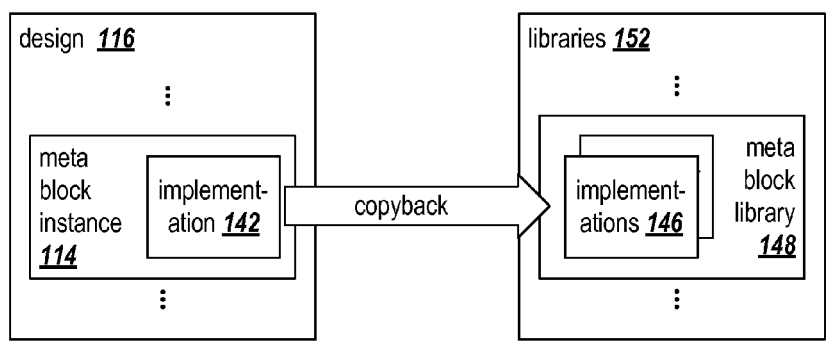
FIG. 5B illustrates the operation of the copyback control.
Figure 5C:
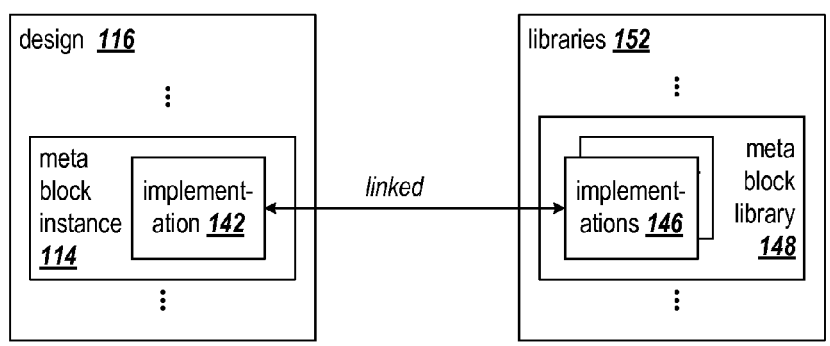
FIG. 5C illustrates the operation of the link control.

FIG. 5A illustrates a user interface for relating updates made to an implementation between a meta block instance and the corresponding implementation in a meta block library. FIG. 5B illustrates operation of the copyback control, and FIG. 5C illustrates operation of the link control.

In one embodiment, the three controls are made accessible in the pulldown menu 502. The pulldown menu may be activated by a designer by right-clicking on graphical object 108 in the user interface window 102, for example. In response to selection of the copyback control, the current state of the implementation in the meta block instance is copied back to the meta block library for that meta block. The state of the meta block instance includes the parameter values for that meta block instance as described above, along a description of any nested blocks and their parameter values.

FIG. 5B shows implementation 142 being copied back to the meta block library 148. The implementation may be copied over an existing implementation in the meta block library 148, and thereby replace the previous version of the implementation. Alternatively, changed implementation 142 maybe saved as a new implementation in meta block library 148. In one embodiment, the designer is provided with the options of replacing the current implementation in the library or creating a new implementation. It will be recognized that with the copyback control the designer must initiate the control each time a change is made to an implementation of a meta block instance, in order for that change to be reflected in the meta block library.

The link control may be used by the designer to eliminate having to manually initiate the copyback control each time a change is made to the implementation in a meta block instance. The link control establishes a linked state between the implementation in the meta block instance and the corresponding implementation in the meta block library for that meta block instance.

FIG. 5C illustrates the linked state between implementation 142 in meta block instance 114 and a corresponding one of the implementations 146 in the meta block library 148. In response to a designer updating the implementation 142 in the meta block instance 114, that change is automatically stored to the corresponding one of implementations 146. Also, since the link is bi-directional, in response to the designer updating the corresponding one of implementations 146 in the meta block library 148, the implementation 142 is automatically updated with the latest state of the corresponding implementation.

The unlink control removes the linked state between an implementation in a meta block instance and the corresponding implementation in the meta block library. Thus, changes made by the designer to the implementation 142 are not automatically applied to the corresponding one of implementations 146 in the meta block library 158. Nor are updates made to the implementation in the meta block library automatically reflected in the implementation in the meta block instance after the unlinking.

Figure 6:
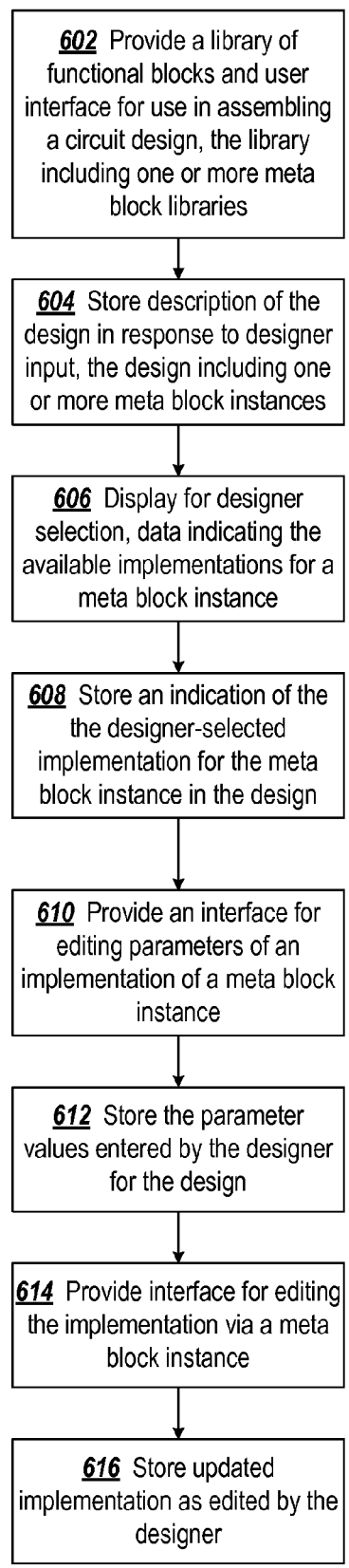
FIG. 6 is a flowchart of an example process for preparing an electronic circuit design in accordance with various embodiments of the invention.

FIG. 6 is a flowchart of an example process for preparing an electronic circuit design in accordance with various embodiments of the invention. A library of predefined functional blocks and a user interface are provided to a designer at step 602. The functional blocks in the library include functional blocks with single implementations and meta blocks with multiple, alternative implementations. Through the user interface, the designer selects and connects the functional blocks and meta blocks for the design. The description of the design is stored at step 604 in response to control input by the designer.

For instances of meta blocks in the design, the user interface provides controls for the designer to specify a selected one of multiple implementations at step 606. For each instance of a meta block in the design, the designer-selected implementation is stored in association with overall design data at step 608.

The user interface also provides for updating the parameters of a meta block instance at step 610. As described above, along with general parameters of the meta block instance the designer can specify a particular simulation engine. These parameter values are stored in association with the meta block instance at step 612.

The implementation of a meta block instance is editable via the user interface at step 614. Through the user interface, the designer can change those blocks that comprise the implementation, the connections between those blocks, and the parameters associated with those blocks. At step 616, the updated implementation is stored in association with the meta block instance. As described above, the updated implementation may also be automatically stored to the meta block library if the link control had been previously invoked for the meta block instance. Otherwise, the copyback control may be invoked by the designer to store the updated implementation in the meta block library.

It will be clear to those of skill in the art that the steps of the method illustrated in FIG. 6 need not be performed in the order illustrated. For example, one or more of the storing steps (604, 608, 612, and 616) may be performed after the remaining steps (606, 610, and 614) have been performed, e.g., the design might not be stored until after all of the data entry has been performed by the designer. Further, some embodiments may not include of the illustrated steps. For example, some meta blocks might not have parameters to edit, so steps 614 and 616 may be omitted. It will be clear to those of skill in the art that the invention can be practiced within these and other variations.

Figure 7:
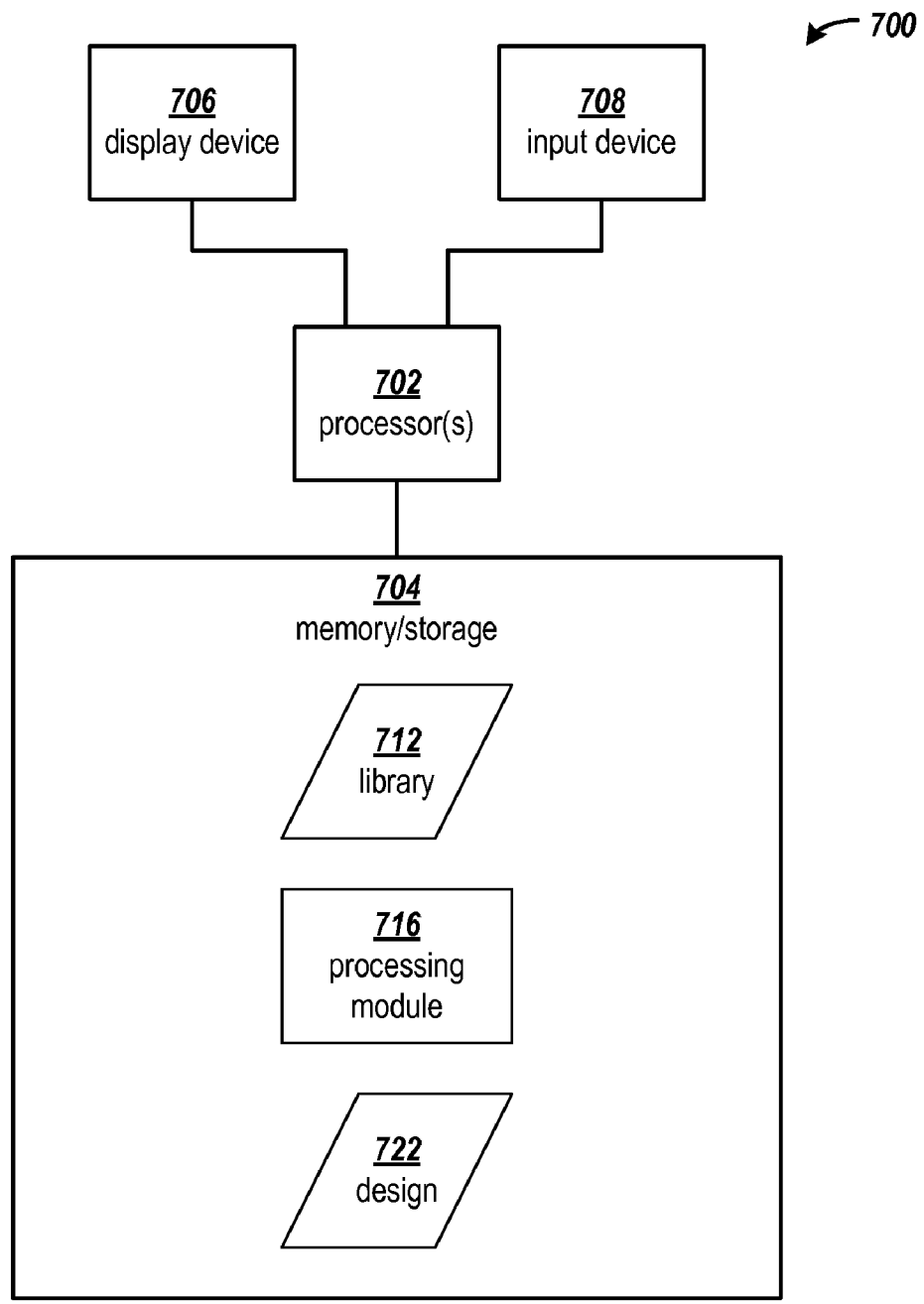
FIG. 7 is a block diagram of an example computing arrangement on which the processes described herein may be implemented.

FIG. 7 is a block diagram of an example computing arrangement or data processing system on which the processes described herein may be implemented. Those skilled in the art will appreciate that various alternative computing arrangements, including one or more processors and a memory arrangement configured with program code, would be suitable for hosting the processes and data structures and implementing the algorithms of the different embodiments of the present invention. In addition, program code that implements the processes may be provided via a variety of computer-readable storage devices or delivery channels such as magnetic or optical disks or tapes, electronic storage devices, or as application services over a network.

Computing arrangement 700 includes one or more processors 702 coupled to a memory/storage arrangement 704. The processor is coupled to one or more display devices 706 for outputting design data to the user and coupled to one or more input devices 708 for receiving input data and controls from a user. The architecture of the computing arrangement depends on implementation requirements, as would be recognized by those skilled in the art. The processor 702 may be one or more general purpose processors, or a combination of one or more general purpose processors and suitable co-processors, or one or more specialized processors (e.g., RISC, pipelined, etc.).

The memory/storage arrangement 704 is representative of hierarchical storage commonly found in computing arrangements. Such hierarchical storage typically includes multiple levels of cache memory, a main memory, and local and/or remote persistent storage such as provided by magnetic disks (not shown). The memory/storage arrangement may include one or both of local and remote memory/storage, remote storage being coupled to the processor arrangement via a local area network, for example.

The processor arrangement 702 executes the software stored in memory/storage arrangement 704, and reads data from and stores data to the memory/storage arrangement according to the processes described above. An operating system (not shown) manages the resources of the computing arrangement. The processing module 716 generally provides the user interface for creating, editing, and storing a design as described above. The design 722 resulting from the described processes is stored in the memory/storage arrangement.

The present invention is thought to be applicable to a variety of systems for preparing circuit designs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of assembling an electronic circuit design, comprising:
   performing operations by one or more processors in a computing arrangement, the operations including:
   instantiating and coupling a plurality of instances of functional blocks in the design in response to designer input, wherein the plurality of instances of functional blocks includes at least one meta block instance and at least one instance that is not a meta block instance;
   wherein each meta block instance has two or more alternative implementations, each instance that is not a meta block instance has a single implementation, and each implementation is synthesizable;
   displaying the plurality of instances of functional blocks as respective graphical objects;
   displaying for designer selection, identifiers of the two or more implementations for the meta block instance from a meta block library;
   in response to designer selection of one implementation of the two or more instances, storing a specification of the selected one implementation for the meta block instance in association with the design;
   in response to designer selection of a graphical object corresponding to the at least one meta block instance, displaying a designer-editable version of the one implementation; and
   storing an updated specification of the one implementation associated with design in response to designer modification of the designer-editable version of the one implementation.

2. The method of claim 1, further comprising:
   providing designer-selectable controls for managing updates to the specification of the selected one implementation associated with the design and implementations in the meta block library, wherein the controls include a copyback control; and
   in response to designer selection of the copyback control, storing the updated specification of the one implementation in the meta block library.

3. The method of claim 1, further comprising:
   providing designer-selectable controls for managing updates to the specification of the selected one implementation associated with the design and implementations in the meta block library, wherein the controls include a link control and an unlink control;
   in response to designer selection of the link control for the at least one meta block instance, setting a state of the at least one meta block instance to linked;
   automatically storing the updated specification in the meta block library in response to the state of the at least one meta block instance being linked;
   in response to designer selection of the unlink control for the at least one meta block instance, setting the state of the at least one meta block instance to unlinked; and in response to the state of the at least one meta block instance being unlinked, disabling automatic storing of the updated specification in the meta block library.

4. The method of claim 3, further comprising:

in response to the state of the at least one meta block instance being linked and a modification to the selected one implementation in the meta block library, automatically updating the specification of the selected one implementation associated with the design; and in response to the state of the at least one meta block instance being unlinked, disabling automatic updating of the specification of the selected one implementation associated with the design with a modified selected one implementation in the meta block library.

5. The method of claim 1, further comprising:

providing a designer-selectable control for selecting one of a plurality of simulation engines for the at least one meta block instance, wherein the simulation engines include a block-based simulation engine, a software simulation engine, and a hardware simulation engine;

in response to designer selection of a simulation engine for the at least one meta block instance, storing an identifier of the selected simulation engine in association with the at least one meta block instance; and generating a simulation model of the meta block instance for the selected simulation engine from the specification of the selected one implementation associated with the design.

6. An article of manufacture, comprising:

a processor-readable storage device configured with instructions for assembling an electronic circuit design, the instructions when executed by one or more processors causing the one or more processors to perform operations including:

instantiating and coupling a plurality of instances of functional blocks in the design in response to designer input, wherein the plurality of instances of functional blocks includes at least one meta block instance and at least one instance that is not a meta block instance;

wherein each meta block instance has two or more alternative implementations, each instance that is not a meta block instance has a single implementation, and each implementation is synthesizable;

displaying the plurality of instances of functional blocks as respective graphical objects;

displaying for designer selection, identifiers of the two or more implementations for the meta block instance from a meta block library;

in response to designer selection of one implementation of the two or more instances, storing a specification of the selected one implementation for the meta block instance in association with the design;

in response to designer selection of a graphical object corresponding to the at least one meta block instance, displaying a designer-editable version of the one implementation; and storing an updated specification of the one implementation associated with design in response to designer modification of the designer-editable version of the one implementation.

7. The article of manufacture of claim 6, the operations further comprising:

providing designer-selectable controls for managing updates to the specification of the selected one implementation associated with the design and implementations in the meta block library, wherein the controls include a copyback control; and in response to designer selection of the copyback control, storing the updated specification of the one implementation in the meta block library.

8. The article of manufacture of claim 6, the operations further comprising:

providing designer-selectable controls for managing updates to the specification of the selected one implementation associated with the design and implementations in the meta block library, wherein the controls include a link control and an unlink control;

in response to designer selection of the link control for the at least one meta block instance, setting a state of the at least one meta block instance to linked;

automatically storing the updated specification in the meta block library in response to the state of the at least one meta block instance being linked;

in response to designer selection of the unlink control for the at least one meta block instance, setting the state of the at least one meta block instance to unlinked; and in response to the state of the at least one meta block instance being unlinked, disabling automatic storing of the updated specification in the meta block library.

9. The article of manufacture of claim 8, the operations further comprising:

in response to the state of the at least one meta block instance being linked and a modification to the selected one implementation in the meta block library, automatically updating the specification of the selected one implementation associated with the design; and in response to the state of the at least one meta block instance being unlinked, disabling automatic updating of the specification of the selected one implementation associated with the design with a modified selected one implementation in the meta block library.

10. The article of manufacture of claim 8, wherein the two or more implementations are synthesizable.

11. The article of manufacture of claim 6, the operations further comprising:

providing a designer-selectable control for selecting one of a plurality of simulation engines for the at least one meta block instance, wherein the simulation engines include a block-based simulation engine, a software simulation engine, and a hardware simulation engine;

in response to designer selection of a simulation engine for the at least one meta block instance, storing an identifier of the selected simulation engine in association with the at least one meta block instance; and generating a simulation model of the meta block instance for the selected simulation engine from the specification of the selected one implementation associated with the design.

12. A computing arrangement, comprising:

at least one processor;

a memory arrangement coupled to the processor; and a display device coupled to the processor;

wherein the memory is configured with instructions for assembling an electronic circuit design, the instructions when executed by the processor causing the processor to perform operations including:

instantiating and coupling a plurality of instances of functional blocks in the design in response to designer input, wherein the plurality of instances of functional blocks includes at least one meta block instance and at least one instance that is not a meta block instance;

wherein each meta block instance has two or more alternative implementations, each instance that is not a meta block instance has a single implementation, and each implementation is synthesizable;

displaying the plurality of instances of functional blocks as respective graphical objects;

displaying for designer selection, identifiers of the two or more implementations for the meta block instance from a meta block library;

in response to designer selection of one implementation of the two or more instances, storing a specification of the selected one implementation for the meta block instance in association with the design;

in response to designer selection of a graphical object corresponding to the at least one meta block instance, displaying a designer-editable version of the one implementation; and storing an updated specification of the one implementation associated with design in response to designer modification of the designer-editable version of the one implementation.

13. The computing arrangement of claim 12, the operations further comprising:

providing designer-selectable controls for managing updates to the specification of the selected one implementation associated with the design and implementations in the meta block library, wherein the controls include a copyback control; and in response to designer selection of the copyback control, storing the updated specification of the one implementation in the meta block library.

14. The computing arrangement of claim 12, the operations further comprising:

providing designer-selectable controls for managing updates to the specification of the selected one implementation associated with the design and implementations in the meta block library, wherein the controls include a link control and an unlink control;

in response to designer selection of the link control for the at least one meta block instance, setting a state of the at least one meta block instance to linked;

automatically storing the updated specification in the meta block library in response to the state of the at least one meta block instance being linked;

in response to designer selection of the unlink control for the at least one meta block instance, setting the state of the at least one meta block instance to unlinked; and in response to the state of the at least one meta block instance being unlinked, disabling automatic storing of the updated specification in the meta block library.

15. The computing arrangement of claim 14, the operations further comprising:

in response to the state of the at least one meta block instance being linked and a modification to the selected one implementation in the meta block library, automatically updating the specification of the selected one implementation associated with the design; and in response to the state of the at least one meta block instance being unlinked, disabling automatic updating of the specification of the selected one implementation associated with the design with a modified selected one implementation in the meta block library.

16. The computing arrangement of claim 14, wherein the two or more implementations are synthesizable.

17. The computing arrangement of claim 12, the operations further comprising:

providing a designer-selectable control for selecting one of a plurality of simulation engines for the at least one meta block instance, wherein the simulation engines include a block-based simulation engine, a software simulation engine, and a hardware simulation engine;

in response to designer selection of a simulation engine for the at least one meta block instance, storing an identifier of the selected simulation engine in association with the at least one meta block instance; and generating a simulation model of the meta block instance for the selected simulation engine from the specification of the selected one implementation associated with the design.

* * * * *